US008620064B2

(12) United States Patent
Ravid et al.

(10) Patent No.: US 8,620,064 B2
(45) Date of Patent: Dec. 31, 2013

(54) METHOD FOR IMAGING WORKPIECE SURFACES AT HIGH ROBOT TRANSFER SPEEDS WITH REDUCTION OR PREVENTION OF MOTION-INDUCED DISTORTION

(75) Inventors: Abraham Ravid, Cupertino, CA (US); Todd Egan, Fremont, CA (US); Karen Lingel, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 703 days.

(21) Appl. No.: 12/707,548

(22) Filed: Feb. 17, 2010

(65) Prior Publication Data

US 2011/0199477 A1    Aug. 18, 2011

(51) Int. Cl.
  *G06K 9/00*    (2006.01)
(52) U.S. Cl.
  USPC .............. 382/152; 348/44; 348/87; 348/145; 382/144; 382/149; 382/154
(58) Field of Classification Search
  None
  See application file for complete search history.

(56) References Cited

U.S. PATENT DOCUMENTS

| | | | |
|---|---|---|---|
| 5,980,194 A | 11/1999 | Freerks et al. | |
| 2004/0143602 A1* | 7/2004 | Ruiz et al. | 707/104.1 |
| 2005/0225642 A1 | 10/2005 | Spill | |
| 2007/0071581 A1 | 3/2007 | Gilchrist et al. | |
| 2007/0073439 A1* | 3/2007 | Habibi et al. | 700/213 |
| 2008/0013822 A1 | 1/2008 | Pai et al. | 382/145 |
| 2008/0101912 A1 | 5/2008 | Martin et al. | 414/935 |
| 2008/0168673 A1* | 7/2008 | Herchen et al. | 33/550 |
| 2008/0276867 A1 | 11/2008 | Schaller | |
| 2009/0026657 A1 | 1/2009 | Nimmakayala et al. | |

FOREIGN PATENT DOCUMENTS

| | | |
|---|---|---|
| JP | 2002-246447 A | 8/2002 |
| JP | 2007-034168 A | 2/2007 |
| JP | 2008-198797 A | 8/2008 |
| JP | 2009-218622 A | 9/2009 |
| WO | WO-2009-086042 A2 | 7/2009 |

OTHER PUBLICATIONS

U.S. Appl. No. 12/707,335, Ravid, et al., filed Feb. 17, 2010.
U.S. Appl. No. 12/707,499, Ravid et al., filed Feb. 17, 2010.
Official Action Dated Aug. 3, 2012 Issued in Co-Pending U.S. Appl. No. 12/707,499.
Official Action Dated Dec. 4, 2012 Issued in Co-Pending U.S. Appl. No. 12/707,335.

* cited by examiner

*Primary Examiner* — Andy Rao
*Assistant Examiner* — Tyler Edwards
(74) *Attorney, Agent, or Firm* — Robert M. Wallace

(57) ABSTRACT

A method is provided for imaging a workpiece by capturing successive frames of an elongate stationary field of view transverse to a workpiece transit path of a robot, while the workpiece is transported by the robot. The robot transit path is illuminated with an elongate illumination pattern transverse to the transit path to obtain a workpiece image of successive frames. Motion-induced image distortion is prevented or reduced adjusting the camera frame rate in real time in proportion to changes in robot velocity profile of the workpiece along the transit path.

20 Claims, 15 Drawing Sheets

METHOD FOR IMAGING WORKPIECE SURFACES AT HIGH ROBOT TRANSFER SPEEDS WITH REDUCTION OR PREVENTION OF MOTION-INDUCED DISTORTION

BACKGROUND

In semiconductor processing, systems are employed that can process a number of workpieces simultaneously. The workpieces may be semiconductor wafers for fabrication of ultra large-scale integrated circuits or display panels or solar arrays, or the workpieces may be masks employed in photolithography. For semiconductor wafers, the wafers may be robotically transferred at high speed (e.g., 1.7 meters per second) through a factory interface for transfer to any one of a number of parallel processing chambers or modules. The centering of the wafer on the wafer support pedestal within each processing chamber is critical and must be consistent. For example, one of the processing chambers may be employed to deposit a film on the wafer surface, while a small annular region at the wafer periphery is masked to prevent film deposition in the peripheral region. This annular peripheral region may also be referred to as the film annular exclusion region or zone. Film deposition in the annular peripheral region may be prevented by photolithographic masking during film deposition or by other suitable techniques. For example, the film layer may be removed from the annular peripheral region following film deposition over the entire wafer surface. Any error or inconsistency in the placement of the wafer on the wafer support pedestal in the reactor chamber can cause the film layer annular region boundary to be non-concentric with the wafer edge. Such non-concentricity may cause the radial width of the annular region at the wafer periphery to vary with azimuthal angle, so that in some cases the width of the annular region may be greater or lesser than the width required to comply with the required production specifications.

Some attempts have been made to provide early warning of variations or error in wafer placement, by detecting non-concentricity of the film layer when the wafer is transferred to or from the processing chamber in which the film layer is masked or deposited. Most of these techniques are based on measurements or detection with the wafer outside the process tool. In-situ measurements of features on the wafer (such as non-concentricity or film-free annular region width) have been sought in order to save space in the fabrication area and provide more timely results. However, accurate in-situ measurement of the width or concentricity of the film edge exclusion annular region has been hampered by the high speed at which the wafer is transferred. Such high speed (and/or acceleration or deceleration) can cause the wafer image to be distorted from the true circular shape of the wafer. In the prior art, wafer images requiring high accuracy could not be obtained while the wafer was in motion. Therefore, an approach has been to slow down or stop the wafer motion while an image of the wafer is acquired from which the film layer concentricity and width may be accurately measured. This approach reduces productivity.

What is needed is a way in which the geometry of various surface features on the wafer (e.g., film layer concentricity and width) may be accurately measured without slowing down the wafer motion from the high speed at which the robot travels (e.g., 1.7 meters per second). Another need is for accurate imaging of a wafer in order to detect and locate defects.

SUMMARY

A method is provided for obtaining an image of a workpiece in a processing system including a robot for transporting a workpiece to and from the processing chambers of the system along a workpiece transfer path. The method includes capturing, at variable frame rate, successive frames of an elongate stationary field of view transverse to a transit path portion of the workpiece transit path while the workpiece is transported along the transit path portion by the robot. The method further includes illuminating the transit path portion with an elongate illumination pattern transverse to the transit path portion during the capturing of the successive frames, and defining an image of the workpiece including the successive frames. The method also includes prevention or reduction of motion-induced image, which is carried out by obtaining information defining movement of said robot, and, during the capturing of the successive frames, computing from the robot movement information a current velocity of the workpiece, and adjusting the variable frame rate in accordance with a difference or ratio between said current velocity of said workpiece and a reference velocity. The reference velocity may be a velocity during a previous frame, for example.

In one embodiment, the elongate stationary field of view has a length of at least a workpiece diameter extending transverse to the transit path portion and a width on the order of one picture element of the image.

In one embodiment, the distortion correction is carried out by computing the correct location as a function of a ratio between a width of the workpiece in the respective one of the successive frames and a known workpiece diameter.

In a further embodiment, the distortion correction is carried out by computing the correct location from robot velocity profile information corresponding to movement of the robot. In this further embodiment, The robot velocity profile information is obtained either from a robot controller memory that contains data defining a predetermined robot velocity profile or from an encoder that is responsive to movement of the robot.

In one embodiment, the capturing includes capturing a signal from an elongate array of photosensitive elements, and wherein the illuminating includes providing an array of light emitting elements in a pattern that illuminates individual ones of the photosensitive elements through a range of incident angles.

In a yet further embodiment, the transit path portion corresponds to a Y-axis parallel to the transit path portion and an X-axis normal to the Y-axis, the method further including correcting X-axis coordinates in In a yet further embodiment, the method further includes correcting the image for distortion from vibration of the workpiece in a plane of the workpiece. This latter embodiment may be carried out by finding the motion of a center of the wafer in successive ones of the frames, defining an average motion of the center of the wafer through the successive frames, and, for each frame containing a difference between the wafer center and the average motion of the center of the wafer, shifting the image by the difference.

In yet another embodiment, the method further includes correcting the image for distortion from vibration of the workpiece in a direction transverse to the plane of the workpiece. This latter embodiment may be carried out by determining an apparent workpiece radius from the image and determining a radial correction factor as a ratio between the apparent workpiece radius and a known workpiece radius, and scaling radial locations in the image by the radial correction factor.

In another embodiment, the method further includes smoothing movement of the correct location over the successive frames by fitting predetermined velocity profile data of the robot to the movement of the correct location to produce a fitted robot velocity profile, and obtaining the correct location for each of the successive frames from the fitted robot velocity profile.

In a further embodiment, the method measures non-concentricity by determining a center of the workpiece in each one of the frames, determining a motion of the center of the workpiece over the successive frames, matching the motion of the center of the workpiece to a sinusoidal function, and deducing a sinusoidal amplitude as an amplitude of non-concentricity of the workpiece and a sinusoidal phase angle as a direction of non-concentricity of the workpiece. These results may be used by providing the amplitude of non-concentricity and the direction of non-concentricity as corrective feedback to the robot.

In a yet further embodiment, respective wavelengths of light are emitted from respective parallel rows of discrete light emitters, wherein each one of the rows emits a monochromatic spectrum corresponding to a respective one of the wavelengths. In a first related embodiment, a particular one of the parallel rows of light emitters is selected for activation during capturing of the successive frames depending upon a type of material in a layer on the workpiece to be illuminated. In a second related embodiment, different wavelengths of light are emitted during capturing of successive ones of the frames by activating successive ones of the rows of light emitters, whereby to produce a color image of the workpiece.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
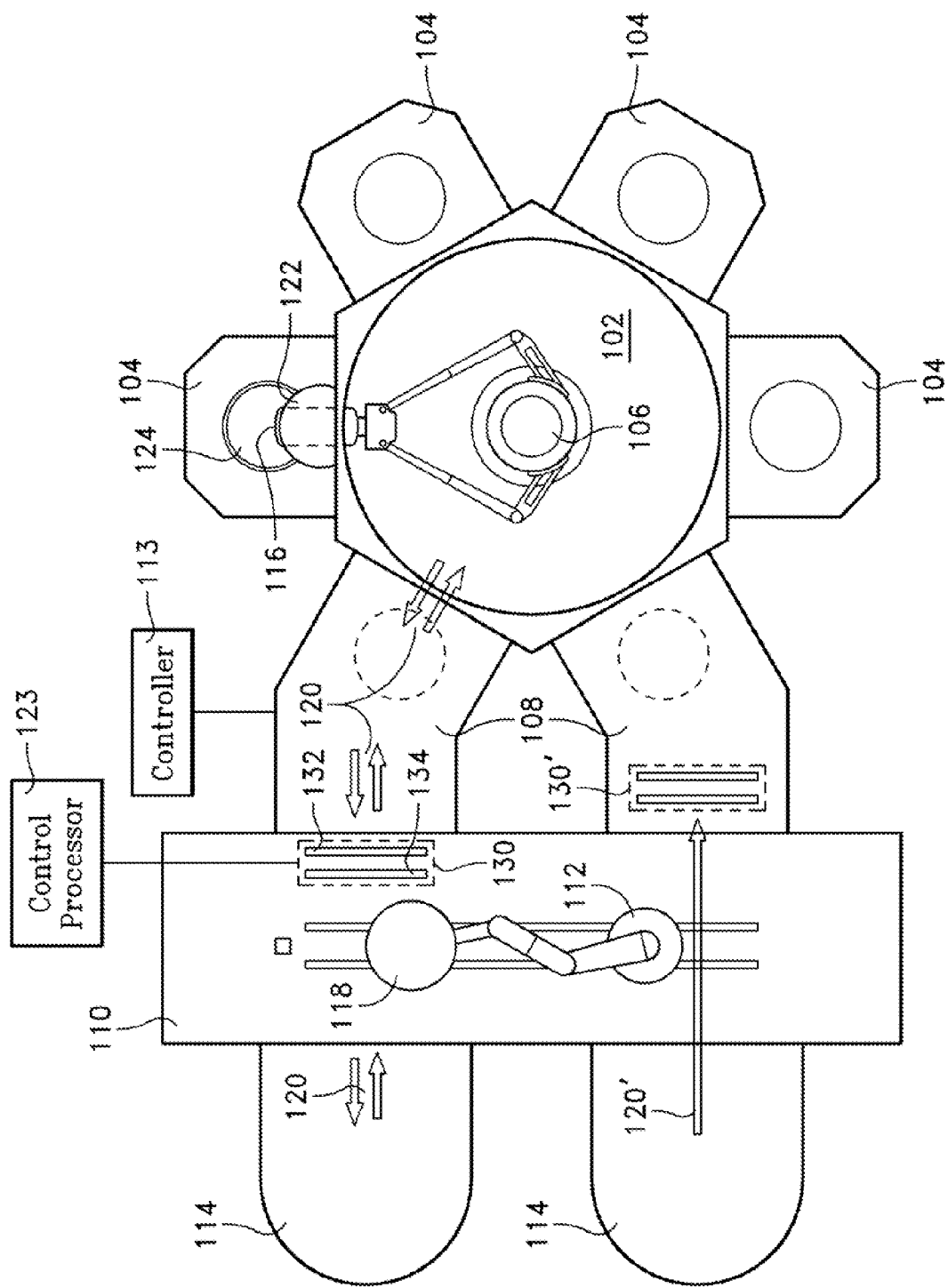
FIG. 1 depicts an exemplary wafer processing system including a wafer image capture apparatus in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

FIG. 1 depicts a wafer processing tool that includes a vacuum transfer chamber 102 coupled to four wafer processing chambers 104, all held at sub-atmospheric pressure. A vacuum robot 106 transfers individual wafers between any one of the processing chambers 104 and any one of two load lock chambers 108. A factory interface 110 is at atmospheric pressure, and includes an atmospheric robot 112 for transferring a wafer between one or more cassettes 114 and the load lock chamber 108. The load lock chamber 108 provides a transition between the atmospheric pressure of the factory interface 110 and the vacuum of the vacuum transfer chamber 102. The vacuum robot 106 holds each wafer on a vacuum robot blade 116, while the atmospheric robot 112 holds each wafer on an atmospheric robot blade 118. The robots 106, 112 move each wafer along a wafer transit path 120 through the factory interface at a high speed of over 1 meter per second, e.g., about 1.7 meters per second. The robots 106, 112 are controlled by a robot controller 113 in accordance with stored instructions defining the velocity profile (acceleration, deceleration, direction, etc.) of each robot blade 116, 118 along the various wafer transit paths.

Each processing chamber 104 has a wafer support pedestal 124 on which a wafer 122 is either placed (or removed) by the vacuum robot 106. The centering of the wafer 122 on the pedestal 124 can affect the concentricity of thin film layers deposited near the wafer edge, such as a film layer. This placement is affected by the placement of the wafer on the atmospheric robot blade 118 and by the placement of the wafer on the vacuum robot blade 116, and/or alignment or centering of the photolithographic mask on the wafer.

Figure 2A:
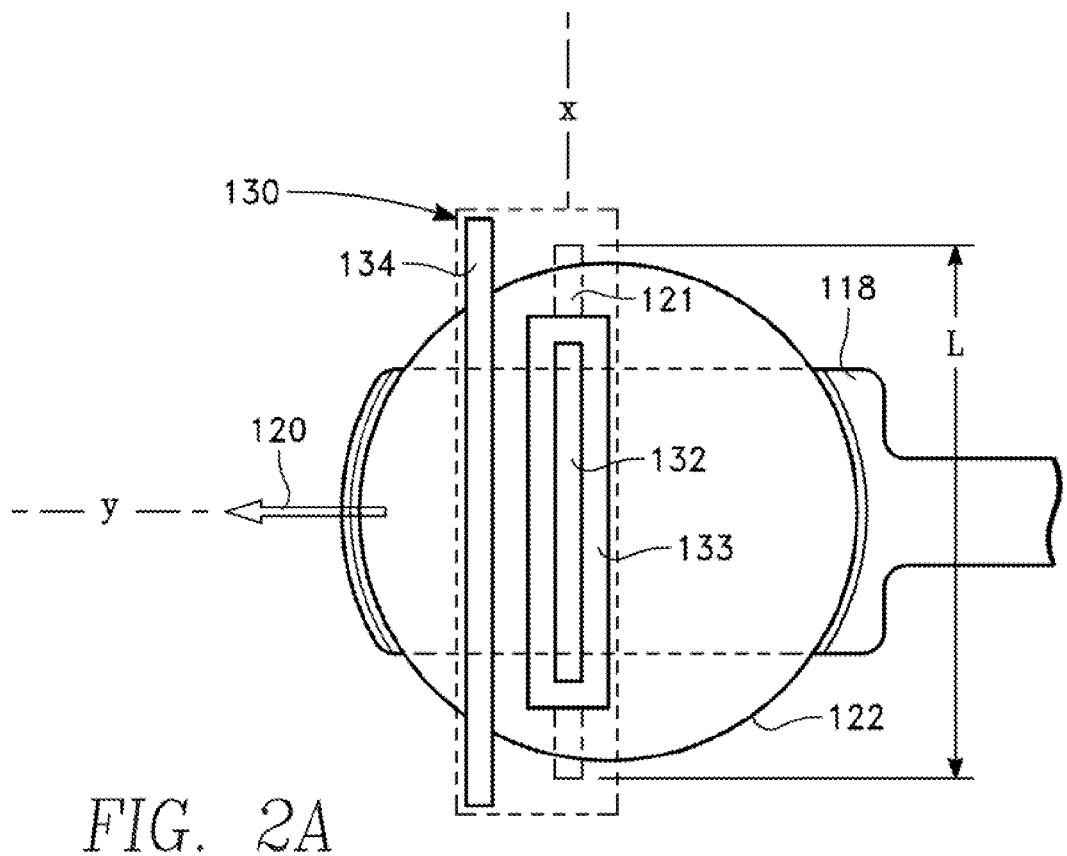
FIGS. 2A and 2B are plan and elevational views respectively of a portion of the system of FIG. 1 in accordance with one embodiment.
Figure 2B:
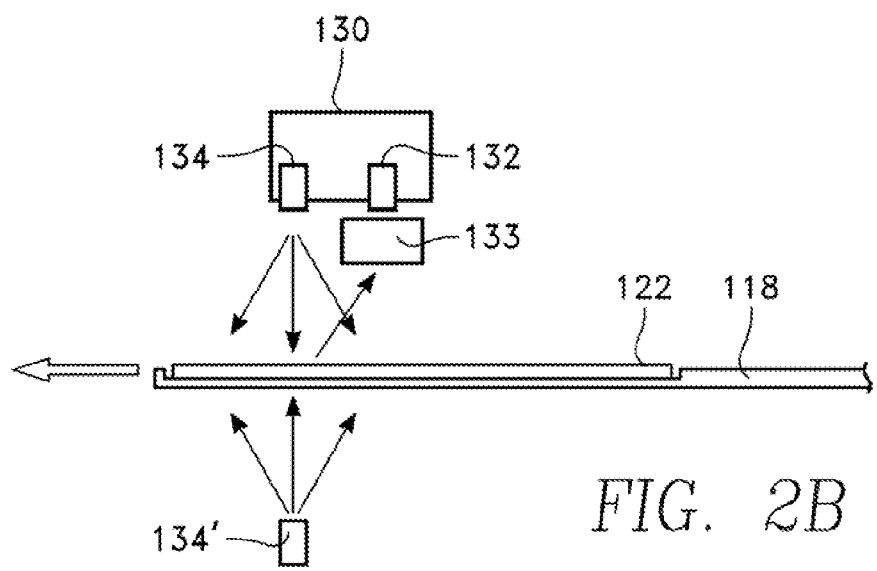
Figure 3:
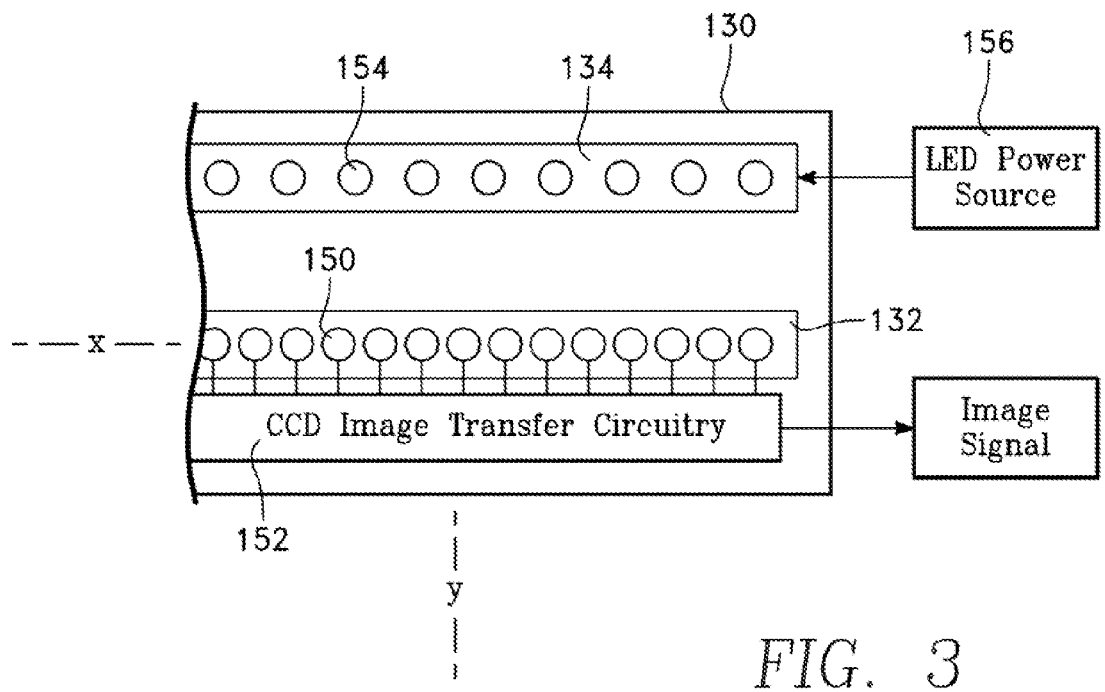
FIG. 3 is a bottom plan view corresponding to FIG. 2A.

An image capture apparatus 130 is placed at a fixed location over a selected portion of the wafer transit path 120. Referring to FIGS. 2A, 2B and 3, the image capture apparatus 130 includes a camera 132, focusing optics 133 and a light source 134. In one embodiment, the camera 132 is implemented as a single line or imaging array of plural photosensor elements 150 depicted in FIG. 3. The camera 132 and the light source 134 may operate in the visible wavelength or in other wavelengths, such as UV, Infra Red or Microwave. In one embodiment, the light source may have a wavelength between 200 nm and 900 nm, for example.

The camera 132 has an elongate thin field of view (FOV) 121 having a length L (as depicted in FIG. 2A) that is transverse to the portion of the wafer transit path 120 underlying the line camera 132. The length L of the field of view 121 is affected by the optics 133. The optics 133 may be designed so that the length L of the field of view 121 exceeds the length of the elongate array of photosensor elements 150. As shown in FIG. 2A, the length L of the field of view 121 extends across the entire diameter of the wafer 122. As depicted in FIG. 2A, the wafer transit path portion 120 beneath the camera 132 lies along a Y-axis, while the length L of the field of view 121 of the camera 132 extends along an X-axis. FIG. 2A shows that the length L of the elongate field of view 121 is transverse to the direction of wafer travel (the Y-axis) in the transit path portion 120 in that it is perpendicular to it. However, in other embodiments the elongate field of view 121 is transverse by being disposed at an acute angle with respect to the Y-axis, or any angle between about 10 and 90 degrees.

An image control processor 123 controls the camera 132 and processes the images provided by the camera 132. The camera 132 capture successive line images (frames) of the wafer 122, and provides these images in succession to the image control processor 123. A raw image of the wafer 122 consists of a succession of such frames covering the entire wafer. The image control processor 123 removes velocity profile-induced distortion from the raw image of the wafer. Further, the image control processor 123 may use the undistorted (corrected) wafer image to perform measurements of various features on the wafer, such as (for example) concentricity of a film layer deposited on the wafer, or to detect some features, such as water droplets or other defects. Alternatively, the image control processor 123 may use the distorted (uncorrected) wafer image to perform the measurements. In this alternative mode, the measurement data may be extracted from the uncorrected image, and the compensation for speed-induced distortion performed for each individual point or picture element (pixel). This correction may be performed by using a look-up table. Such a look-up table may be constructed in a straight-forward manner in the image processor 123 by correlating the locations of individual pixels in the uncorrected image with locations of the corresponding pixels in the corrected image.

In the embodiment depicted in FIG. 1, the image capture apparatus 130 is inside the factory interface 110 and overlies the portion of the wafer transit path 120 lying within the factory interface 110. In an alternative embodiment, an image capture apparatus 130' overlies a wafer transit path 120' inside the load lock chamber 108. The image capture apparatus 130 or 130' may be located in any suitable location overlying a wafer transit path in the wafer processing tool of FIG. 1.

As noted above, the length L of the field of view 121 enables the camera 132 to capture individual images or frames that extend across the diameter of the wafer 122. Each successive image or frame captured by the camera 132 is one (or more) picture element ("pixel") long (along the direction of the wafer transit path 120 or Y-axis) and many (e.g., thousands) of pixels wide along the X-axis. The camera 132 captures one frame at a time. A succession of many such frames provides a raw image of the entire wafer 122. While the drawing depicts a camera having a single row of pixels, in an alternative embodiment, the camera may have multiple rows of pixels.

The raw image may consist of an identification of the location along the Y-axis of each frame captured by the camera 132, and, for each frame, a listing of the luminance values of all the pixels in the frame. As will be described below, the raw image of the wafer is distorted by acceleration or deceleration of the wafer occurring during image capture. This distorts the Y-axis frame locations in the raw image. In embodiments described herein, the distortion is corrected by replacing the Y-axis frame locations given in the raw image with correct Y-axis frame locations.

The side view of FIG. 2B depicts the light rays emanating from the light source 134 and the light ray impinging on the camera 132. As depicted in the bottom plan view of FIG. 3, the camera 132 in one embodiment consists of a line array of individual image-sensing or photosensitive elements 150, which may be individual photosensitive diodes, for example. Each photosensitive element 150 corresponds to an individual picture element or pixel in the captured image. Therefore, each photosensitive element 150 may also be referred to as a pixel. The photosensitive elements 150 are individually coupled to a transfer circuit 152 that assembles the parallel output signals of the photosensitive elements into a desired format (e.g., a serial succession of individual pixel values) and outputs the formatted signal to the image control processor 123.

As described above with reference to FIG. 3, the light source array 134 consists of an array (e.g., a line array) of individual light emitting devices 154. In one embodiment, the light emitting devices 154 are light emitting diodes. A light source electrical power supply 156 is coupled to the light source array 134 to power the individual light emitting devices 154. In one embodiment, the light emitting devices 154 are of the same type and emit the same wavelength spectrum.

The light source array 134 of FIGS. 2A and 2B may be obtained from any one of a number of suppliers. For example, the following LED arrays may be used as the light source array 134: an LED array emitting at a wavelength of 830 nm by Opto Diode Corporation of Newbury Park, Calif.; an LED array emitting at 620 nm by StockerYale, Inc. of Salem, N.H. The line camera 132 may be a UM8 CCD camera from e2v Technologies of Essex, England, having 12,288 photosensitive elements or pixels (corresponding to the photosensitive elements or pixels 150 of FIG. 3), each pixel measuring about 5 microns by 5 microns (in other words, 5 microns on each side). A CCD camera of this type may have a static resolution of 26 µ/pixel, and a resolution of 70-80 p/pixel along the axis of motion (the Y-axis) where the motion of the wafer is about 1.7 meters per second. Nominally, the frame time may be about 50 µsec/frame and the exposure time may be about 35 µsec.

Generally, the camera 132 may have a static resolution in a range of 10-40 µ/pixel, a pixel size in a range of 1-10 microns on each side, a frame width (along the Y-axis) in a range of one to five pixels, and a frame length (along the X-axis) in a range of 5,000-15,000 pixels. The camera 132 may be operated at a frame rate in a range of 10-100 µsec/frame and an exposure time in a range of about 5-80 µsec/frame. The light source array 134 may consist of discrete sources emitting at single wavelength lying in a range of 200-900 nanometers.

Each pixel of a high resolution camera of this type has a very narrow light cone angle through which light rays may be sensed. This angle may be as little as one tenth of a degree for each pixel. This presents a problem whenever reflections from the wafer are deflected from the intended incidence by wafer bowing, for example. Wafer bowing is common in such applications because the process chamber environment may be comparatively hot. As a result, light from the light source array 134 may not be sensed by the camera 132.

Figure 4:
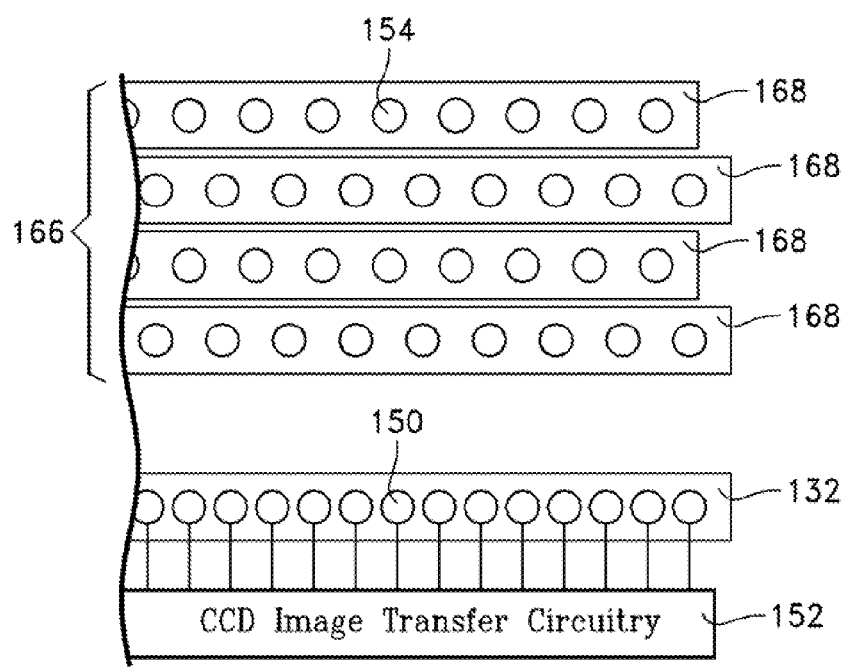
FIG. 4 is a bottom plan view of an alternative embodiment of the image capture apparatus of FIG. 3.

This problem is overcome by providing an enhanced light source array 166 depicted in FIG. 4. The enhanced light source array 166 of FIG. 4 mimics the light output of a diffused light source, providing light rays across a nearly continuous range of angles to each pixel 150 of the camera 132. In this way, regardless of perturbation of the reflected light due to wafer bowing or the like, at least one light ray will fall within the light cone angle of each pixel 150. In the embodiment depicted in FIG. 4, the enhanced light source array 166 has plural rows 168 of light emitting devices 154. The rows 168 may extend a length which is different from the length of the camera 132. The enhanced light source array 166 may have roughly ten light emitting devices 154 for each pixel 150 of the camera 132, providing light from a different angle with respect to a particular pixel. Each light emitting device 154 (which may be a light-emitting diode) radiates light over a wide cone of angles, as much as 20 degrees, for example. Thus, the ten light emitting devices 154 in the enhanced light source array 166 of FIG. 4 illuminating a particular pixel 150 provide light rays in a continuum of angles in a two-dimensional plane to the pixel 150, so that wafer bowing or other perturbations do not prevent light reflection into the narrow light cone of the pixel. In this manner, the enhanced light source array 166 functions in the same way as an ideal diffuse light source.

Figure 5A:
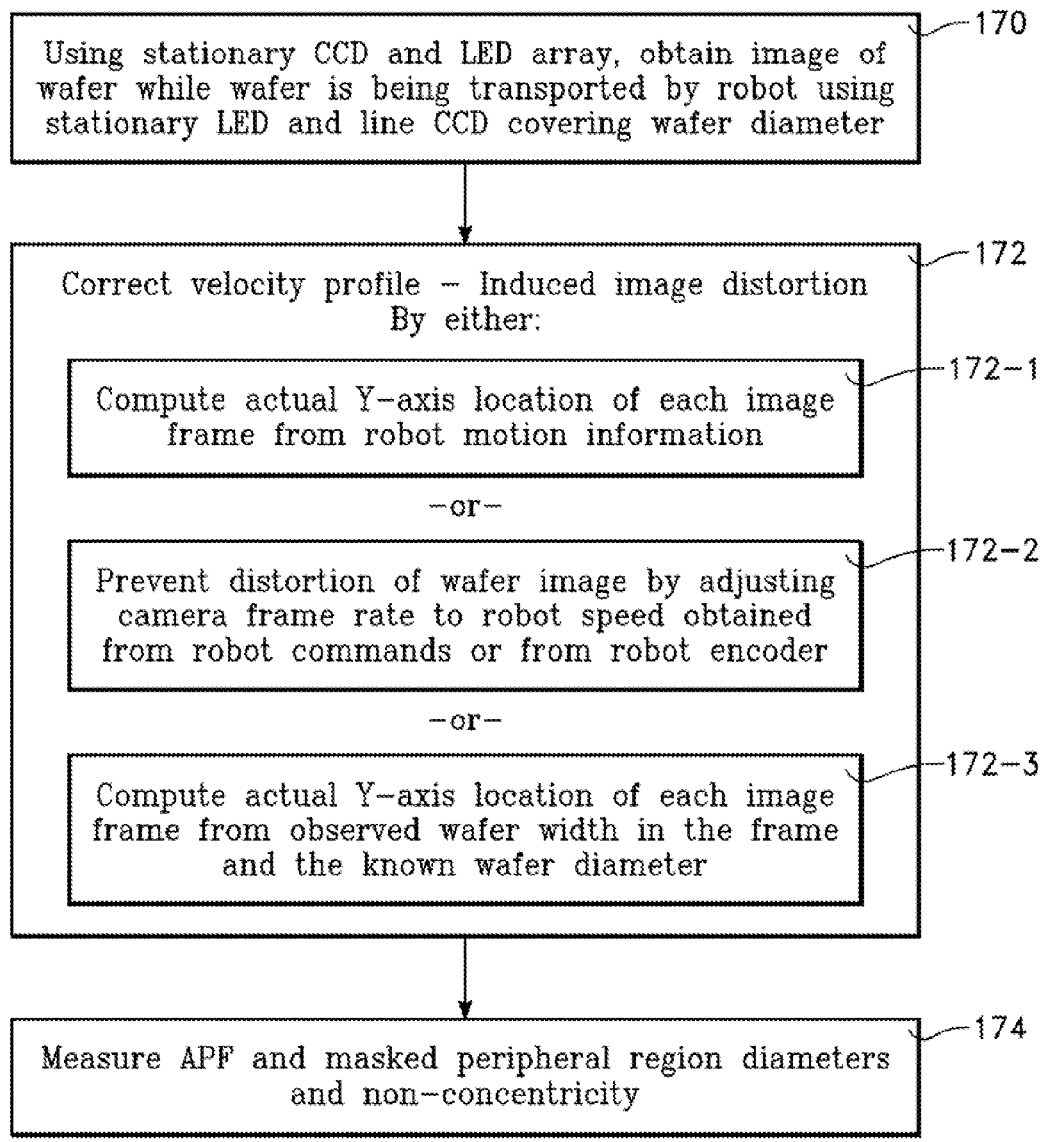
FIG. 5A is a block diagram depicting a method of operating the system in FIG. 1, in accordance with an embodiment.

FIG. 5A depicts a method of employing the foregoing apparatus to measure or detect features on a wafer. The image capture apparatus 130 (stationary camera 132 and light source array 134) is employed to capture an image of a wafer as the wafer is being transported by the robot at high speed (block 170 of FIG. 5A) to produce a succession of frames including a raw image of the entire wafer. In one embodiment, the wafer motion continues at the high speed (over 1 meter per second) of the normal robotic transfer action during image capture. Next, an image processor processes the data of the raw image to remove distortion of the image caused by the velocity profile of the high speed motion of the robot-transported wafer (block 172 of FIG. 5A). The location of each frame along the direction of wafer transit path 120 or Y-axis in the captured image of the wafer is distorted by acceleration or deceleration in the wafer motion profile. For example, the image of a circular wafer may be non-circular. In one embodiment, the distortion is removed in block 172 by replacing the Y-axis location of each frame given in the raw image with the actual Y-axis location of each frame. This produces an undistorted image.

The edges of various features of interest in the distorted or undistorted image are located and various feature dimensions are measured or detected in the undistorted image (block 174 of FIG. 5A). For example, the edges of the wafer and of the film layer may be detected. The non-concentricity of a film layer edge relative to the wafer edge may be measured, and the radial width of a peripheral region lacking the film layer is measured and compared to the required width. The wafer image may be processed to search for and precisely locate features of interest, such as contamination or fiducial features.

The operation of block 172 may be performed in accordance with any one of different methods referred to in blocks 172-1, 172-2 or 172-3 of FIG. 5A.

In the method of block 172-1, the image processor 123 is provided information defining the motion of the robot blade 116 or 118. The information may be stored instructions used by the robot motion controller 113 to govern the robot end effector (blade) motion. Alternatively, the information may be from a motion encoder coupled to the robot. In either case, the information is used by the image control processor 123 to deduce the true position of the robot end effector (and therefore of the wafer) and from that true position, compute the correct Y-axis position of the current image frame. The correct Y-axis position of each frame is combined with the image data of each frame to form an undistorted image.

Figure 5B:
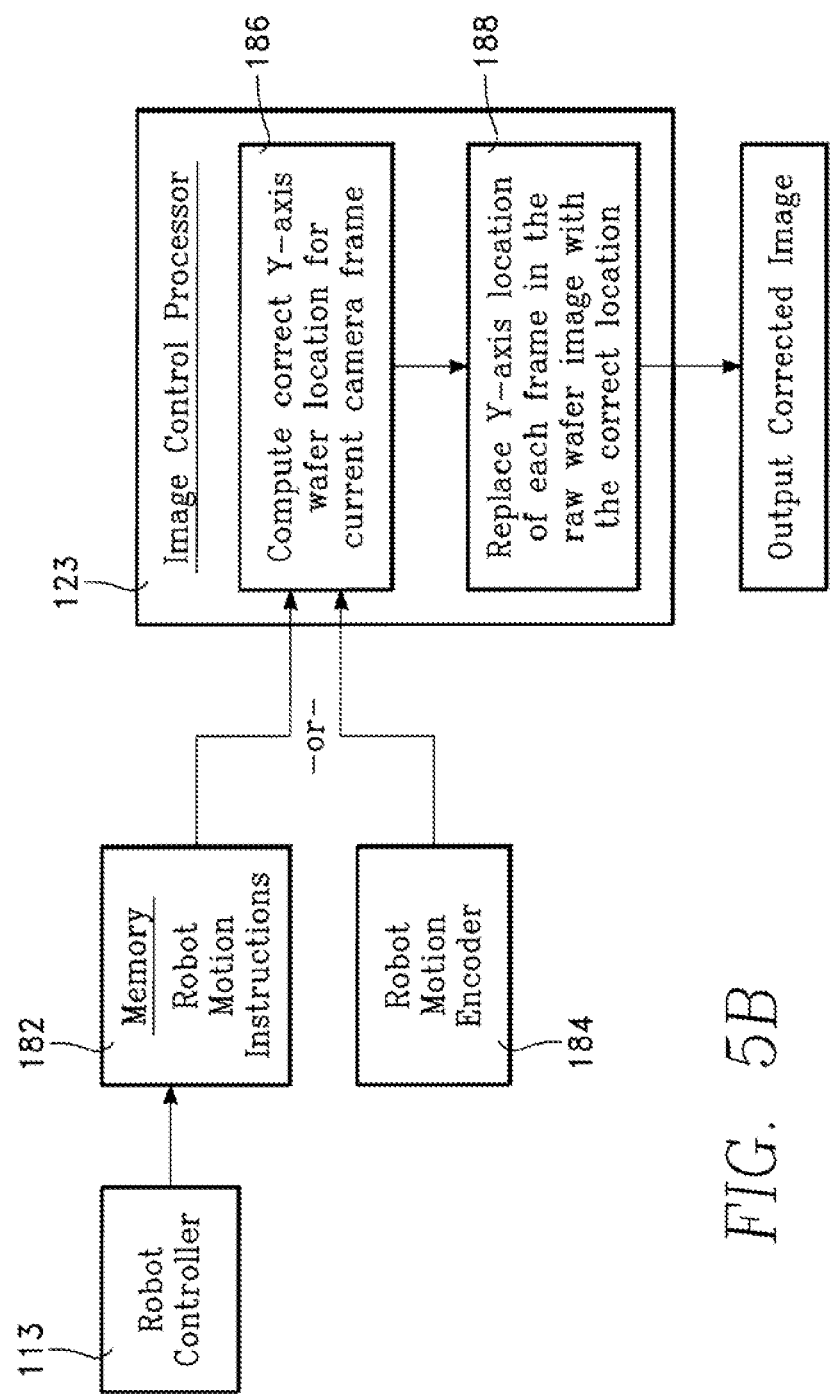
FIG. 5B depicts an apparatus for carrying out the embodiment of block 172-1 of the method of FIG. 5A.

The process of block 172-1 may be carried out by apparatus illustrated in FIG. 5B in accordance with one embodiment. In FIG. 5B, robot motion information is obtained from a reliable source. This source may be a memory 182 associated with the robot controller 113 that stores instructions, commands or definitions employed by the robot controller 113 to govern the motion robot 106 or 112 and/or the robot blade 116 or 118 of FIG. 1. Alternatively, the source of the robot motion information may be an encoder 184 that may be an integral part of one of the robots 106 or 112 or it may be a separate encoder that is coupled to the robot 106 or 112. A computational function 186 within the image control processor 123 uses the robot motion information from the memory 182 or from the encoder 184 to compute the correct Y-axis location of the wafer during the current frame, from which the Y-axis location of the current frame is inferred. An image processing function 188 within the image control processor 123 replaces the Y-axis frame location of the raw image with the correct Y-axis location determined by the computational function 186. This operation is performed for each frame captured by the camera 132. After all captured frames have been thus corrected, the image processor 123 outputs an undistorted image of the wafer.

In the method of block 172-2 of FIG. 5A, the image control processor 123 uses robot motion information to govern the camera frame rate so as to prevent distortion of the wafer image acquired by the camera 132. The image control processor 123 accesses information or data defining the motion of the robot as in block 172-1. However, the image control processor 123 uses this information to deduce the actual velocity of the wafer along the Y-axis during the time of the current frame. The image control processor then adjusts the frame rate of the camera 132 in accordance with any change in wafer velocity following the previous frame so as to maintain a constant ratio between the wafer speed along the Y-axis and the camera frame rate.

Figure 5C:
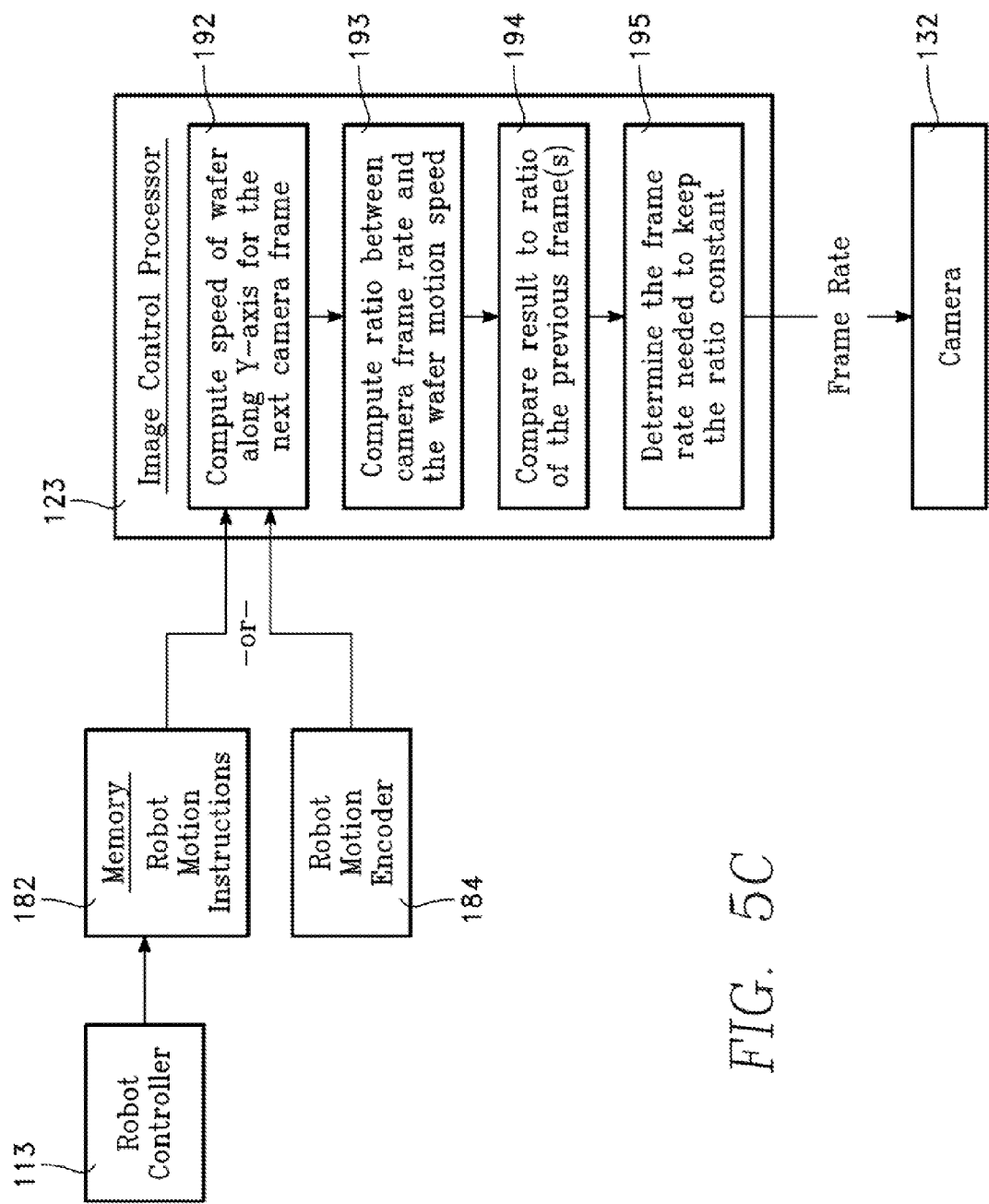
FIG. 5C depicts an apparatus for carrying out the embodiment of block 172-2 of the method of FIG. 5A.

The process of block 172-2 of FIG. 5A may be carried out by the apparatus illustrated in FIG. 5C in accordance with one embodiment. In FIG. 5C, robot motion information is obtained from a reliable source. This source may be the memory 182 associated with the robot controller 113. Alternatively, the source of the robot motion information may be the encoder 184. A computational function 192 within the image control processor 123 uses the robot motion information from the memory 182 or from the encoder 184 to compute the wafer speed along the Y-axis for the next frame. A computational function 193 of the image control processor 123 computes a ratio between the camera frame rate and the wafer speed computed by the function 192. A comparator 194 compares the frame rate-to-wafer speed ratio with the same ratio of a previous frame, and a frame rate computational function 195 determines a new frame rate for the next frame that will keep the frame rate-to-wafer speed ratio constant relative to the previous frame or frames. This new frame rate is applied as a control input to the camera 132. The change in frame rate compensates for acceleration or deceleration of the wafer motion, so that the image acquired by the camera is free or nearly free of motion profile-induced distortion. The frame exposure time may be adjusted in proportion to the change in frame rate.

In the method of block 172-3 of FIG. 5A, the raw (distorted) image of the wafer is used by the image control processor 123 to actually compute the correct (undistorted) Y-axis location of each frame. This is accomplished by first observing the wafer width in the raw image frame and then using the observed wafer width and the known wafer diameter to compute the undistorted Y-axis location of the frame. The image control processor 123 constructs a corrected or undistorted image by substituting the correct Y-axis location of each frame in the image in place of the Y-axis location given by the raw (distorted) image.

In one embodiment, the process of block 172-3 of FIG. 5A is not applied to correct the entire image of the wafer. Instead, for example, only a selected portion of the distorted image is processed, to yield data related to an undistorted image of only the selected portion. For example, if it is desired to calculate the width of the film layer peripheral zone, then only that portion of the image near the edge of the wafer is corrected for distortion by the process of block 172-3. Thus, the result may not be an undistorted image of the wafer, but rather data relating to an undistorted image of a selected portion of the wafer.

Alternatively, the analysis may be performed on the undistorted image and correct for specific frame number or angular position using a lookup table.

Figure 6:
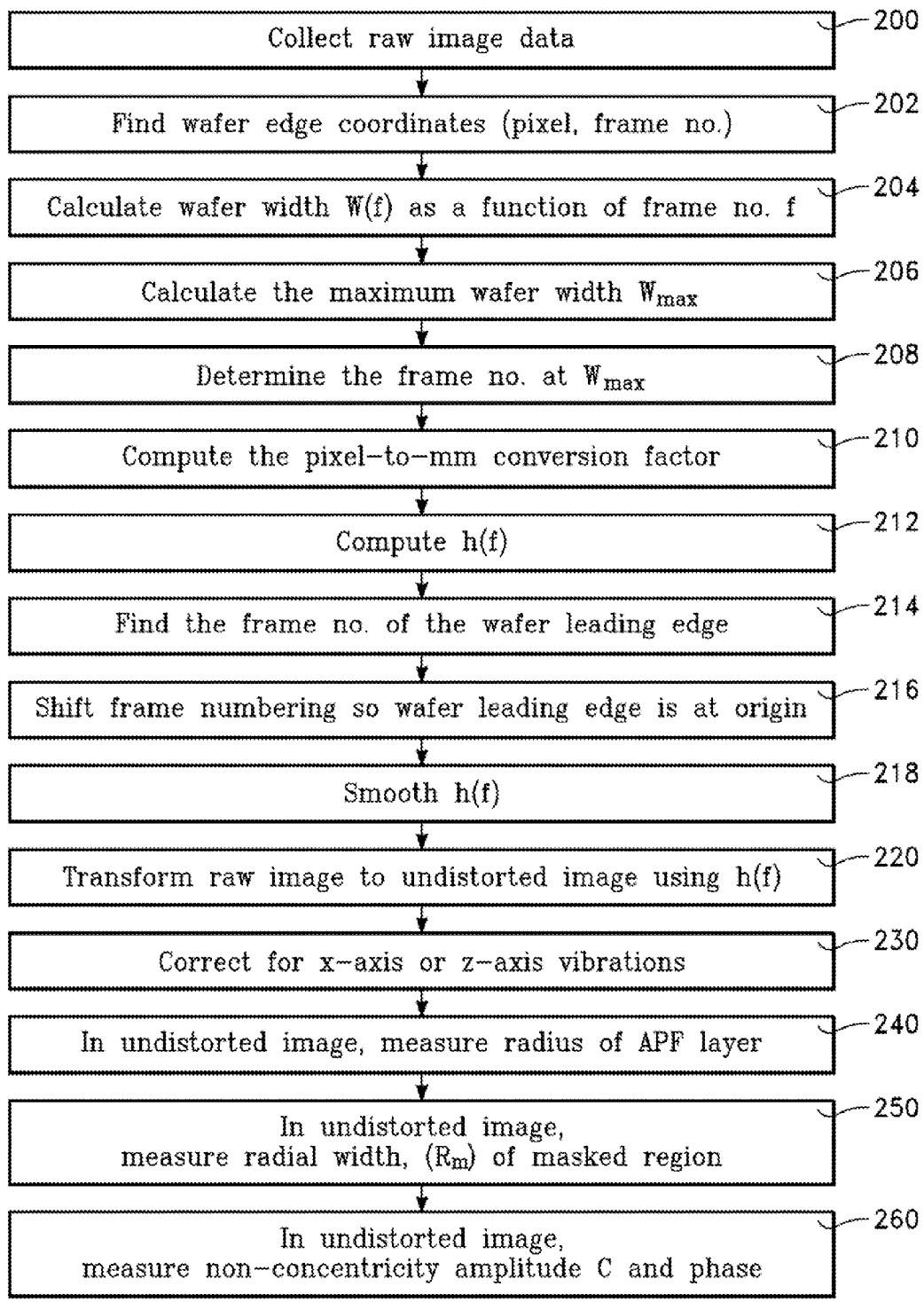
FIG. 6 is a block diagram of the process of block 172-3 of FIG. 5A.

FIG. 6 depicts the process of block 172-3 of FIG. 5A in detail, in accordance with one embodiment. In this embodiment, the true Y-axis location of each frame is computed as a function of the ratio between the wafer width in each frame and the known wafer diameter. The process begins by collecting the data of the raw image of the wafer (block 200 of FIG. 6) frame-by-frame. As described above, each image frame produced by the camera 132 is one pixel wide and thousands of pixels long. A succession of such frames contains the image of the entire wafer. (In an alternative embodiment, the frame may be more than one pixel wide.)

Figure 7:
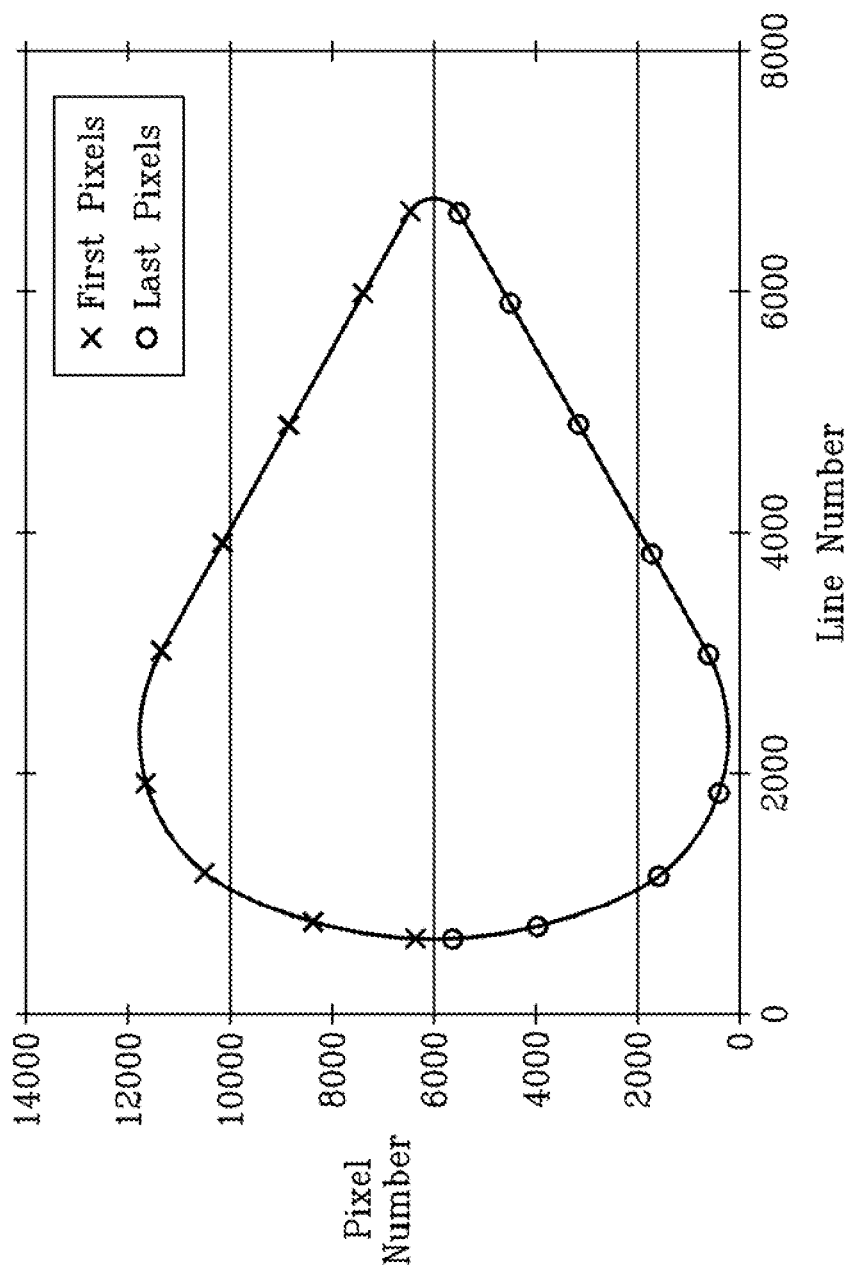
FIG. 7 depicts the raw image of a wafer edge distorted by motion of the wafer while being transferred by the robot.

The image of the wafer edge is obtained (block 202 of FIG. 6). The wafer edge image is obtained by conventional edge-detection image processing techniques. The first and last pixels of the wafer image are then determined for each frame, yielding the wafer edge image depicted in FIG. 7. The graph of FIG. 7 depicts the location (by pixel number) of the first and last pixels of all frames. The first pixels are indicated by X-symbols and the last pixels are indicated by dots, in FIG. 7. Distortion of the wafer shape due to acceleration/deceleration at the high robotic transfer speed during image capture is apparent in FIG. 7.

Figure 8:
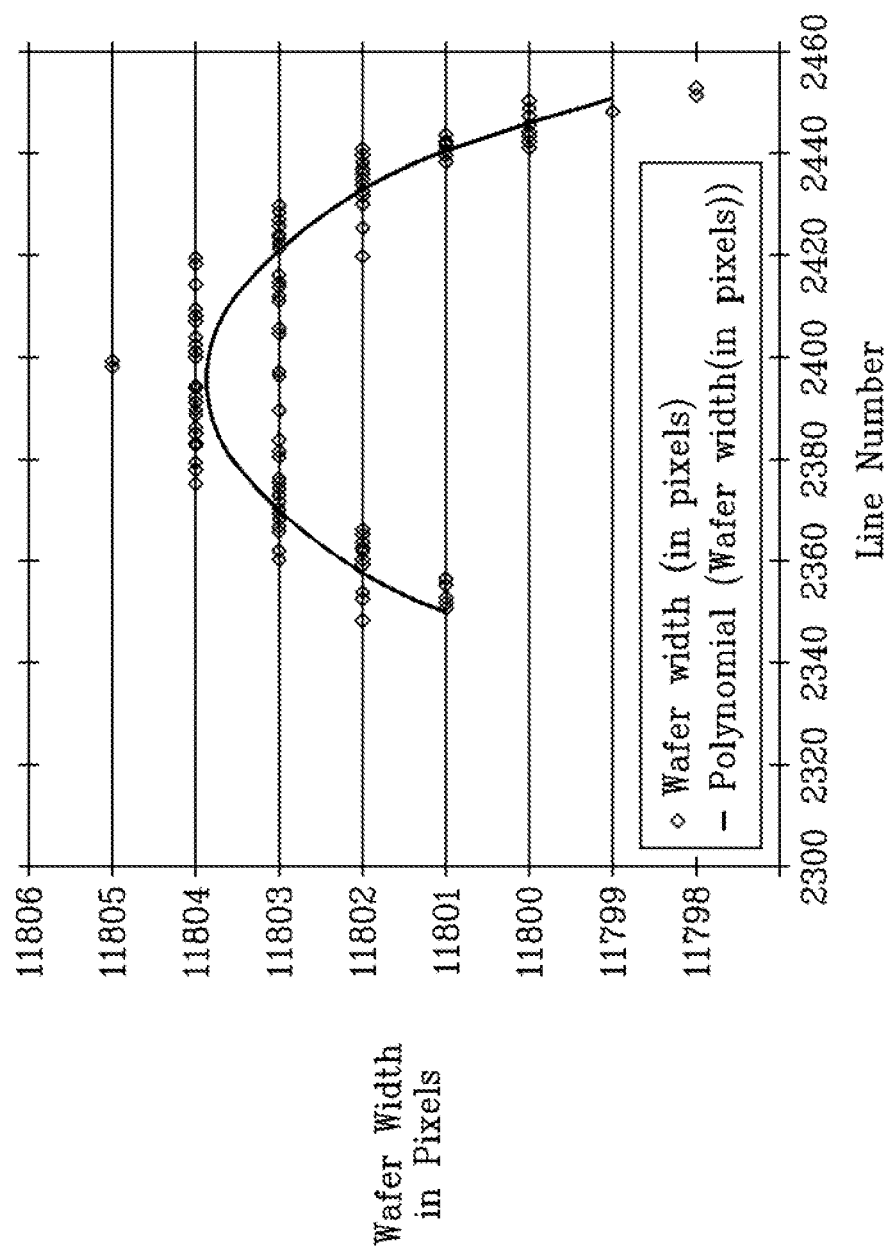
FIG. 8 is a graph of the observed wafer width in pixels as a function of camera frame number, as used in a calculation of the maximum wafer width in the raw image.

The wafer width in each frame is obtained (block 204 of FIG. 6). The wafer width, w, as a function of frame number, f, may be defined as w(f), and is calculated as the distance between the first and last wafer pixels in the corresponding frame. The curve w(f), typically a parabola, is depicted in FIG. 8.

A maximum wafer width, $w(f)_{max}$, corresponds to the wafer diameter and is determined (block 206 of FIG. 6) from the peak of the curve, w(f), which is found using conventional techniques. The frame number in which $w(f)_{max}$ occurs is also noted and defined as $f_{max}$ (block 208 of FIG. 6).

A pixel-to-millimeter conversion factor σ that correlates the distance between pixels (corresponding to individual light sensing elements 150 in the camera 132) and actual distance in millimeters on the wafer surface is obtained (block 210 of FIG. 6). The conversion factor σ is obtained by dividing the maximum width in pixels, $w(f)_{max}$, by the known wafer width, typically 300 mm.

Figure 9:
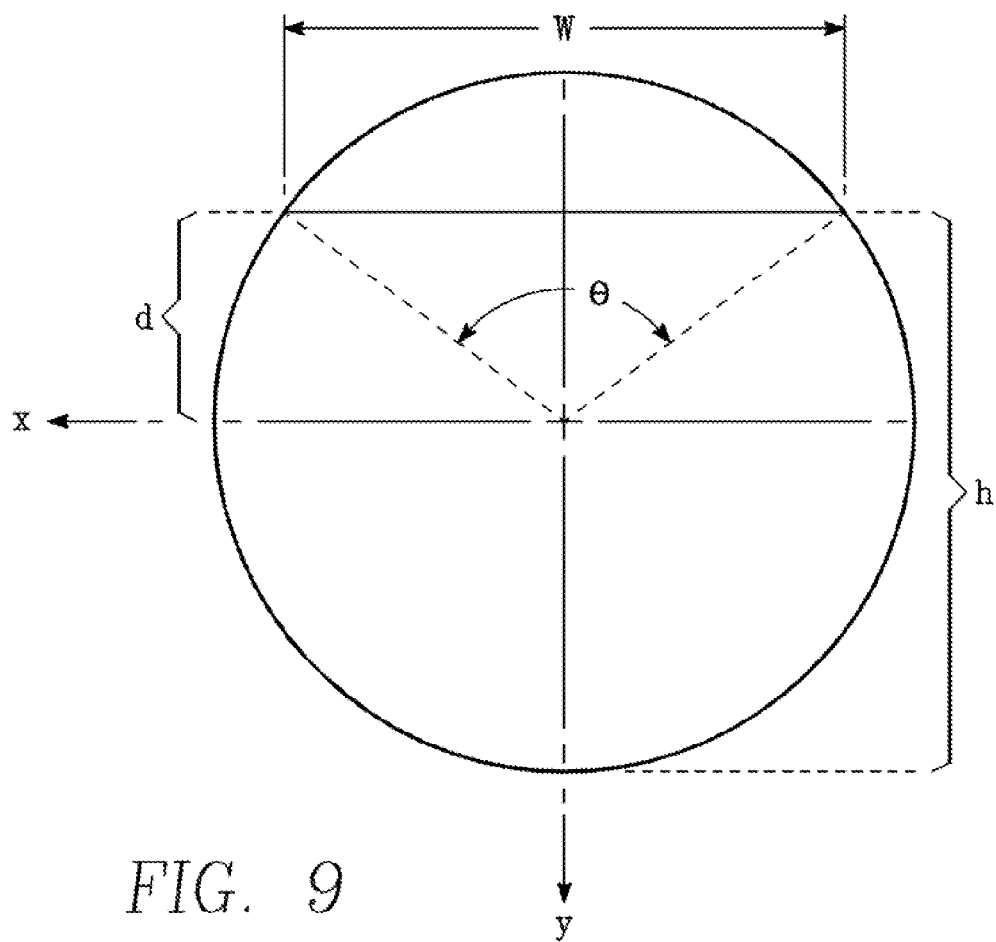
FIG. 9 illustrates the geometry employed in a method of processing the raw image to remove motion-induced distortion.

The raw wafer outline of FIG. 7 is distorted because the wafer acceleration and deceleration distorts the apparent location of each frame along the wafer transit path 120 or Y-axis of FIG. 2A. Correction of such distortion may be performed by replacing the apparent Y-axis location of each frame with the correct Y-axis location. The correct Y-axis location corresponds to the distance of wafer movement along the Y-axis. The distance of wafer movement along the wafer transit path 120 or Y-axis is calculated for each frame from the wafer width w(f) measured in the particular frame (block 212 of FIG. 6). The geometry employed in this calculation is illustrated in FIG. 9. The wafer transit path 120 of FIG. 2A, established by the robot, is the Y-axis of FIG. 9. The general orientation of the line camera 132 corresponds to the X-axis of FIG. 1. The distance of wafer movement along the wafer transit path (Y-axis) as a function of frame number f will be referred to herein as a Y-axis location function h(f), where h denotes the distance and f denotes the frame number. Referring to FIG. 9, for a 300 mm wafer, the wafer width w for a given frame f is related to h as follows:

$$W(\text{in mm})=w(\text{in pixels}) \cdot \sigma \quad \text{(Eqn. 1a)}$$

$$\theta=2\sin^{-1}(W/300 \text{ mm}) \text{ for } W<300 \text{ mm} \quad \text{(Eqn. 1b)}$$

$$\theta=2\sin^{-1}(l) \text{ for } W \geq 300 \text{ mm} \quad \text{(Eqn. 1c)}$$

$$d=W/[2\tan(\theta/2)] \quad \text{(Eqn. 1d)}$$

$$h(f)=150 \text{ mm}-d \text{ for } f \leq f_{max} \quad \text{(Eqn. 1e)}$$

$$h(f)=150 \text{ mm}+d \text{ for } f \geq f_{max} \quad \text{(Eqn. 1f)}$$

The foregoing may be summarized as follows: for values of W within the diameter of the wafer, the Y-axis location function is computed as:

$$h(f)=150 \text{ mm}-W/[2\tan(\sin^{-1}(W/300))] \text{ for a first half of the wafer in which } f \leq f_{max}, \text{ and}$$

$$h(f)=150 \text{ mm}+W/[2\tan(\sin^{-1}(W/300))] \text{ for a second half of the wafer in which } f \geq f_{max}.$$

It is understood that the wafer diameter and radius values (300 mm and 150 mm) present in the foregoing definitions are applicable to a 300 mm wafer, and may be modified depending upon the diameter of the wafer being processed.

In one embodiment, the frame number f in the Y-axis location function h(f) may be defined such that the frame containing the leading edge of the wafer is frame zero, corresponding to the origin. The frame containing the leading edge of the wafer is identified (block 214 of FIG. 6). It may be identified in one embodiment by first plotting the line number of each first and last pixel (found in the step of block 202 of FIG. 6) as a function of pixel number for a group of frames near the wafer leading edge. The frame number containing the leading edge of the wafer corresponds to the minimum value of this function and is found using conventional techniques. The frame numbers of the Y-axis location function h(f) are then shifted so that the leading edge frame number is zero, in one embodiment (block 216 of FIG. 6).

Optionally, the Y-axis location function h(f) may be smoothed (block 218 of FIG. 6) in a process described below in this specification with reference to FIG. 17.

The raw image of the wafer, obtained from the succession of frames output by the camera 132, is corrected for motion-induced distortion (block 220 of FIG. 6). This correction consists of replacing the Y-axis coordinate of each frame by h(f). The foregoing correction to the Y-axis coordinate of each frame produces an image of the wafer in which distortion attributable to wafer motion profile (acceleration/deceleration) along the Y-axis has been removed, which image may be referred to as the undistorted image. This correction permits the image capture to be performed at high wafer transfer speeds without having to stop or slow down the wafer transfer during image capture.

The operation of block 220 may further include scaling and correcting the X-axis coordinate. The X-axis coordinate of any feature of interest in each frame is scaled by the pixel-to-millimeter scale factor σ, while accounting for a misalignment angle β between the major axis of the line camera 132 and the X-axis. The determination of the camera misalignment angle β is described later in this specification with reference to FIG. 11. The X-axis coordinate, $X_{raw\ image}$, obtained from the raw image of any feature of interest is scaled to a corrected value X' as follows:

$$X' = X_{raw\ image} \cdot \sigma - Y \tan \beta \quad \text{(Eqn. 2)}$$

Figure 10:
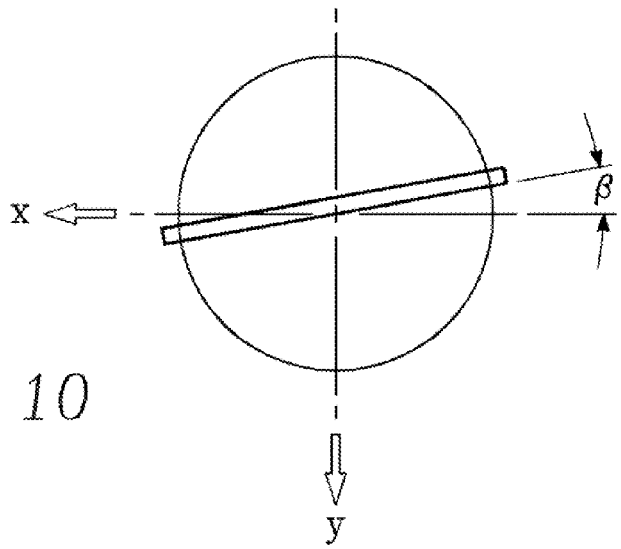
FIG. 10 is a diagram depicting the geometry of the camera misalignment in accordance with one example.
Figure 11:
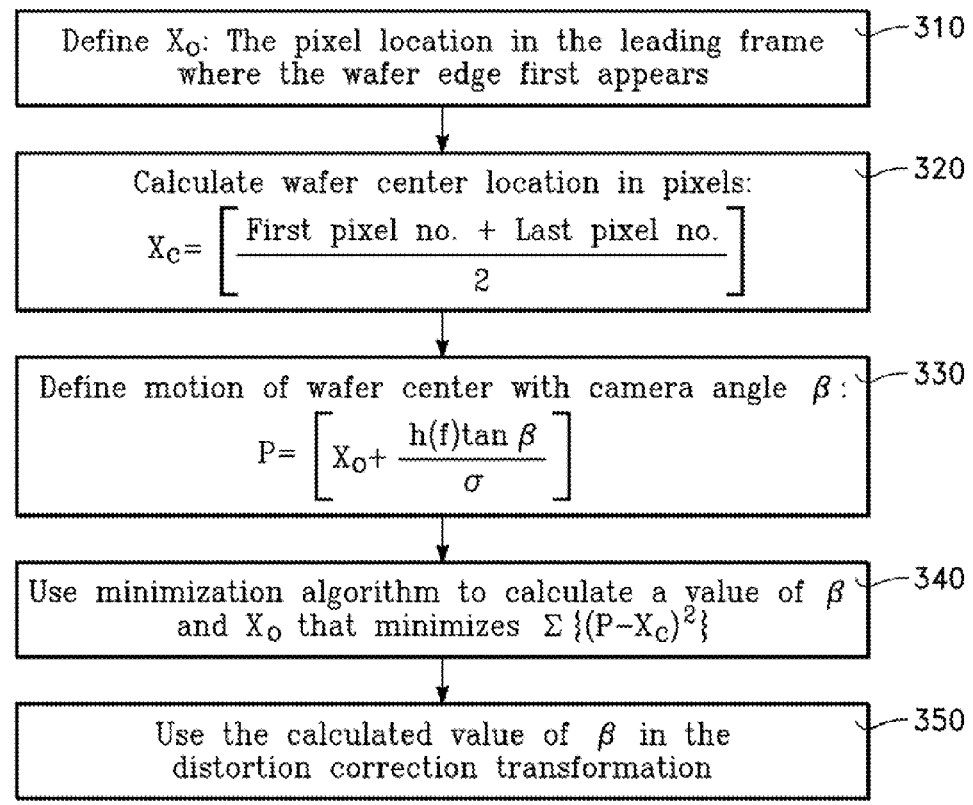
FIG. 11 depicts a method of determing a misalignment angle of the camera from the image data.

How to determine the camera misalignment angle used in Equation (2) above is now described. The misalignment angle β between the long axis of the camera 132 and the X-axis (FIG. 2A) is depicted in FIG. 10, and may be relatively small (less than a few degrees, for example). A method in accordance with one embodiment for determining β from the undistorted wafer image is depicted in FIG. 11. The first step in FIG. 11 is to inspect the wafer image to find a pixel location $X_0$ where the wafer first appears in the wafer leading edge frame $f_{lead}$ (block 310 of FIG. 11). The pixel location of the wafer center $X_C$ is computed for each frame (block 320 of FIG. 11). The wafer center $X_C$ is half the difference between the first and last wafer pixels referred to with reference to block 202 of FIG. 6:

$$X_C = [X_{last\ pixel} + X_{first\ pixel}]/2 \quad \text{(Eqn. 3)}$$

Next, the motion of the wafer center attributable to the misalignment angle is defined (block 330 of FIG. 11) as $$P = X_0 + [h(f - f_{lead}) \tan \beta]/\sigma \quad \text{(Eqn. 4)}$$

A conventional non-linear minimization algorithm is employed to calculate β by minimizing $$\Sigma [P - X_C]^2 \quad \text{(Eqn. 5)}$$

in which the indicated sum is carried out over all frames (block 340 of FIG. 11). This minimization is carried out by adjusting β and $X_0$. This operation corresponds to curve-fitting the motion of the wafer center $X_C$ to a function of tan β. The calculated value of β (obtained by carrying out the minimization of Equation 5) is employed in the computation of Equation (2) described above with reference to block 220 of FIG. 6 (block 350 of FIG. 14), to correct the X-axis coordinate.

In block 230 of FIG. 6, the undistorted image may be corrected for errors due to in-plane vibration or perturbation of the wafer motion (along the X-axis), and corrected for out-of-plane vibration or perturbation of the wafer motion (along the Z-axis). These corrections are described later in this specification with reference to FIGS. 13 and 15.

Various measurements may be accurately performed using the undistorted corrected wafer image produced by the foregoing. For example, the radius or diameter of a film layer may be measured (block 240 of FIG. 6). Also, the annular width of a peripheral exclusion zone that was masked during film deposition may be measured (block 250). The concentricity of the film layer outer boundary with the wafer edge may be measured (block 260) using a method which is now described.

Figure 12A:
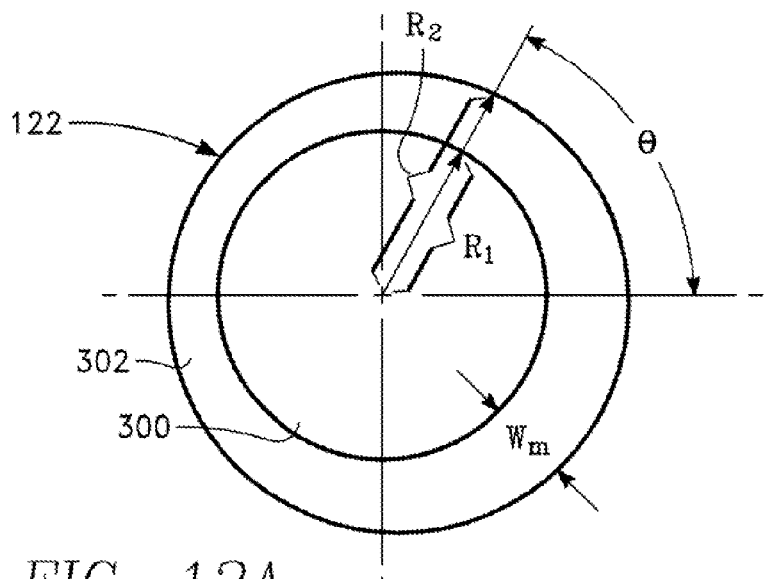
FIGS. 12A, 12B and 12C together depict a method of using the undistorted wafer image to measure non-concentricity of the film layer.
Figure 12B:
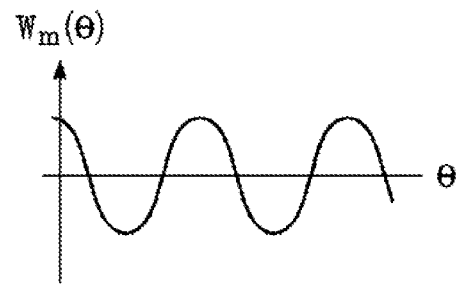

Referring to FIG. 12A, a film layer 300 is deposited on the wafer 122 while being processed in one of the reactor chambers 104 of FIG. 1. The film layer 300 is disk-shaped and is intended to be concentric with the edge of the wafer 122. FIG. 12A depicts an instance in which the film layer 300 is non-concentric with the wafer 122. The film layer 300 has a radius $R_1$ that is smaller than the radius $R_2$ of the wafer 122, leaving a peripheral annular region 302 of the wafer surface that is not covered by the film layer 300. The width of the annular region 302 is $W_M = R_2 - R_1$. Because of the nonconcentricity of the film layer, $W_M$ varies with the azimuthal angle θ and is therefore a function of θ, $W_M(\theta)$. $W_M(\theta)$ is a sinusoidal function that is illustrated in FIG. 12B.

Figure 12C:
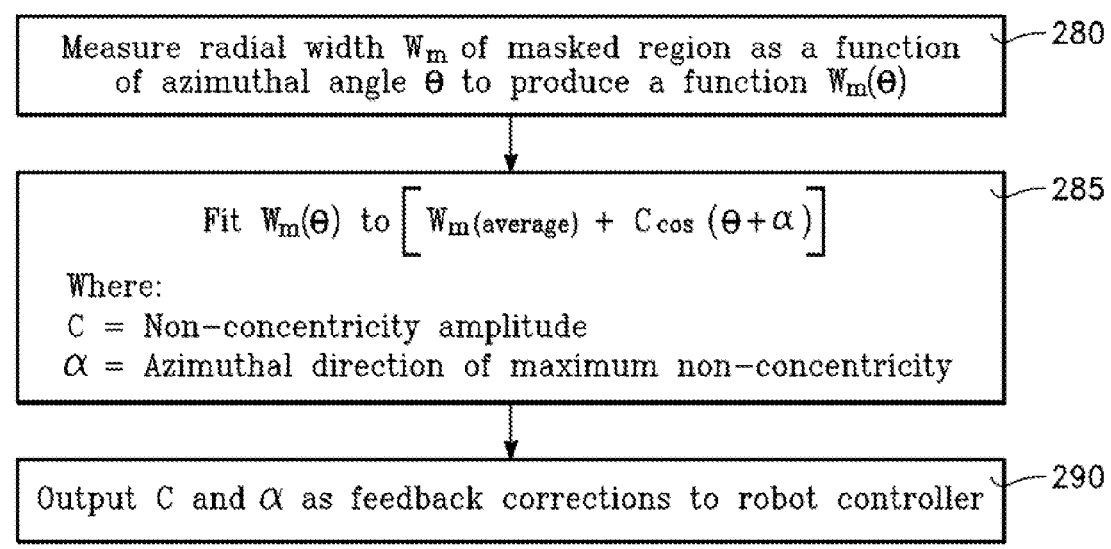

The non-concentricity of the film layer is measured in accordance with a suitable process. An example of such a process is depicted in FIG. 12C. First, the function $W_M(\theta)$ is extracted from the undistorted image data (block 280 of FIG. 12C). A function $$W_M(\text{average}) + C \cos(\theta + \alpha) \quad \text{(Eqn. 6)}$$

is then curve-fitted to $W_M(\theta)$ (block 285 of FIG. 12C). This curve-fitting is performed using conventional techniques. The term $W_M(\text{average})$ is the average value of $W_M$ around the entire wafer edge. The term C is the amplitude of the non-concentricity. The angle α is the azimuthal orientation of the non-concentricity. From the results of the curve-fitting, the actual values of C and α are obtained and output as corrective error feedback to the robot controller 113 for correction of the motion of one of the robots 106 or 112 (block 290 of FIG. 12C).

Figure 13:
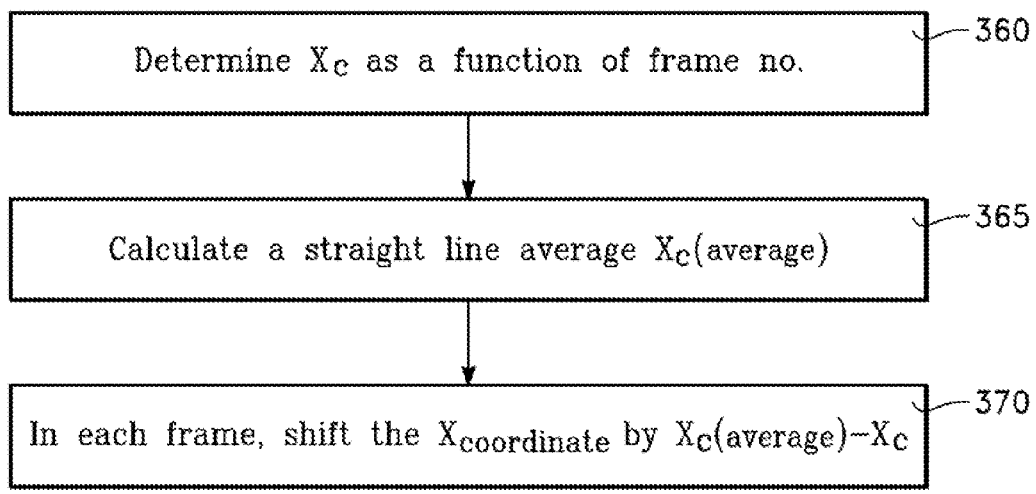
FIG. 13 depicts a method of correcting the image data for errors caused by wafer vibration along the X-axis.
Figure 14:
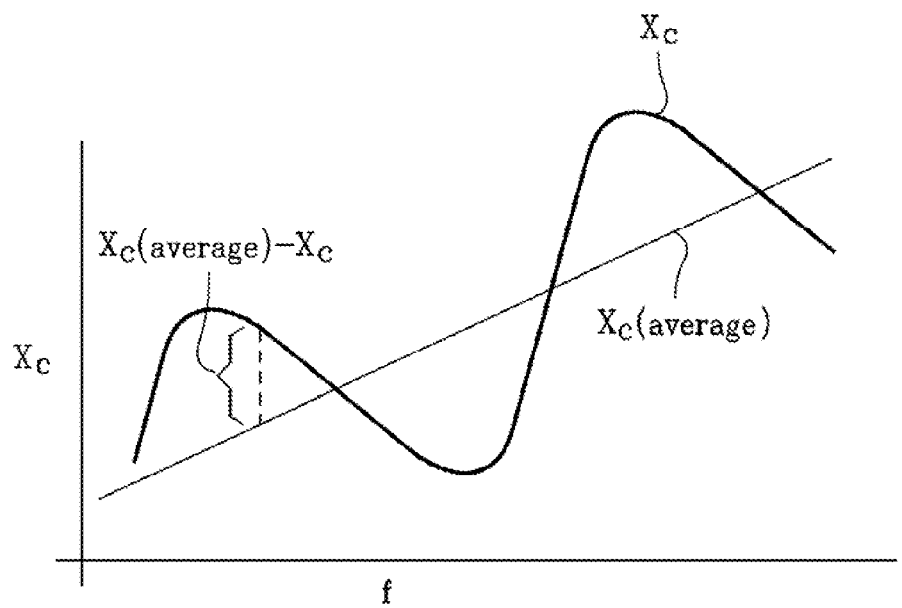
FIG. 14 is a graph of the wafer center location along the X-axis as a function of the shifted frame number, used to perform the method of FIG. 13.

FIG. 13 depicts a method in accordance with one embodiment for carrying out the correction of distortion in the image attributable to in-plane (or X-axis) vibration in the step of block 230 of FIG. 6. First, the motion of the wafer center $X_C$ is determined from the wafer image as a function of frame number (block 360 of FIG. 13), which is the same operation as block 320 of FIG. 11. The motion of the wafer center $X_C$ as a function of frame number is illustrated in the graph of FIG. 14. From the data defining $X_C$ as function of frame number, an average value of $X_C$ between the minima and maxima in $X_C$ is determined using conventional techniques (block 365 of FIG. 13). This average value is labeled $X_C(\text{average})$ in FIG. 14, and generally follows a straight line, as depicted in FIG. 14. (The slope of the straight line $X_C(\text{average})$ is a function of the camera offset angle β discussed previously.) The distortion attributable to X-axis vibration is removed by determining the difference between $X_C(\text{average})$ for that frame and $X_C$ for that frame, and shifting all X coordinates in the frame by that difference, namely the difference $\{X_C(\text{average}) - X_C\}$ (block 370 of FIG. 13).

In one embodiment, the foregoing correction may be made to the image to remove in-plane vibration distortions, and the resulting image used to perform a desired calculation (such as a calculation of the film peripheral zone width). In an alternative embodiment, the foregoing corrections are not applied to the wafer image. Instead, the desired calculation is performed on the image containing the in-plane vibration distortions, and then the foregoing correction is applied to the results of that calculation.

Figure 15:
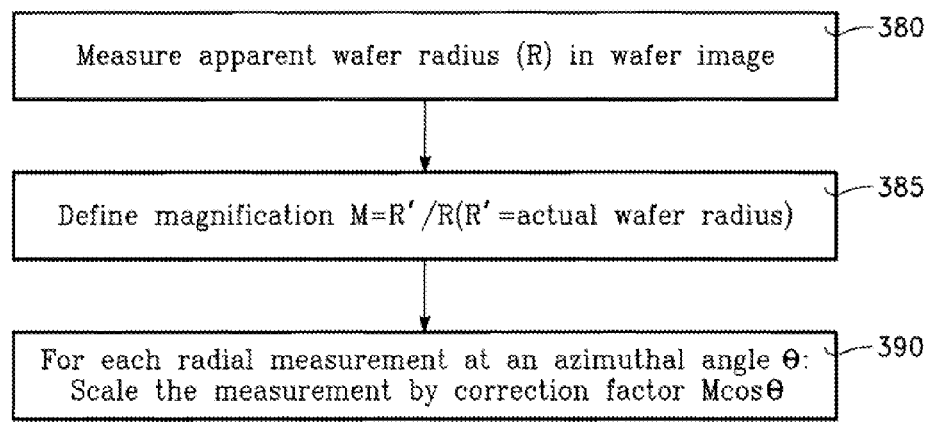
FIG. 15 depicts a method of correcting radial measurements from the image data for errors caused by out-of-plane vibration (along the Z-axis).
Figure 16:
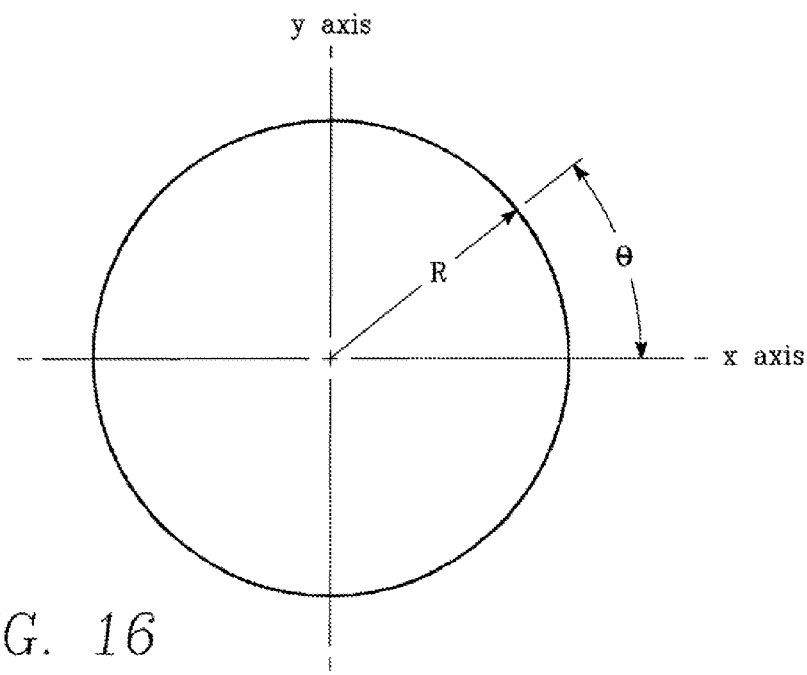
FIG. 16 is a graph of the geometry employed in the method of FIG. 15.

FIG. 15 depicts a method in accordance with one embodiment for carrying out the correction of distortion in the image attributable to out-of-plane (or Z-axis) vibration in the step of block 230 of FIG. 6. For each image of a workpiece, the apparent workpiece (wafer) radius R is determined as half the workpiece width determined in accordance with Equation 1 above (block 380 of FIG. 15). A magnification ratio M is then computed from R and from the known wafer radius (e.g., 150 mm) as M=150 mm/R (block 385 of FIG. 15). Thereafter, each measurement of a radial distance along a particular azimuthal angle θ as depicted in FIG. 16 (such as the location of the wafer edge, the location of the film layer edge, the width of the peripheral region 302, etc.) is scaled by a magnification correction factor M cos θ (block 390 of FIG. 15). This corresponds to a scaling of the image in polar coordinates by scaling the radius in accordance with the magnification ratio M.

In one embodiment, the foregoing correction may be made to the image to remove out-of-plane vibration distortions, and the resulting image used to perform a desired calculation (such as a calculation of the film peripheral zone width). In an alternative embodiment, the foregoing corrections are not applied to the wafer image. Instead, the desired calculation is performed on the image containing the out-of-plane vibration distortions, and then the foregoing correction is applied to the results of that calculation.

Figure 17:
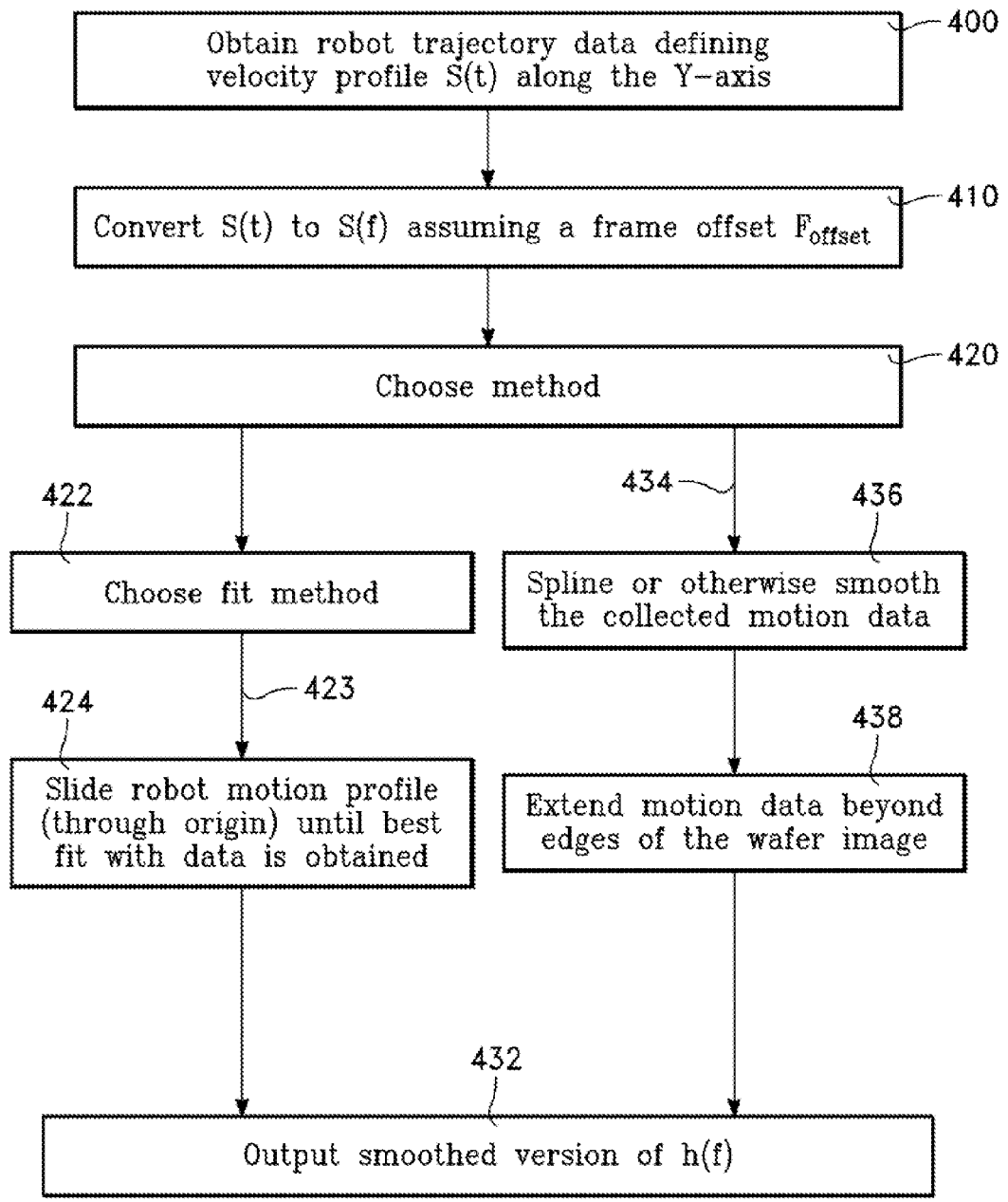
FIG. 17 is a simplified block flow diagram of methods of smoothing the undistorted wafer motion function.

A process for smoothing of the Y-axis wafer motion function h(f), performed in block 218 of FIG. 6, is depicted in FIG. 17 in accordance with an embodiment. The trajectory of the robot blade along the wafer transit path in the field of view of the image capture apparatus 130 of FIG. 1 is obtained (block 400 of FIG. 17). This trajectory defines a robot motion profile s(t) along the Y-axis (wafer transit path beneath the image capture apparatus 130 of FIGS. 1 and 2A). The robot motion profile s(t), a function of time, is converted to a motion profile as a function of frame number by multiplying the time t by the frame rate of the camera 132 (block 410 of FIG. 17) to obtain a robot frame number f, for each value of time t. The converted robot motion profile, $s(f_r)$ is a function of the robot frame number $f_r$, having an arbitrary origin. The robot motion profile is then fitted to the wafer motion profile obtained from the wafer image data in the step of block 216 of FIG. 6, using either one of two different methods. Alternatively, the Y-axis wafer motion function is smoothed using conventional techniques without using the robot motion profile. One of these three methods is chosen (block 420 of FIG. 17). If the choice is a robot motion-based method, then one of the two robot motion-based methods is chosen (block 422).

A first one of the two robot motion-based methods (branch 423 of block 422 of FIG. 17) fits the robot motion profile by sliding the robot motion profile $s(f_r)$ relative to the wafer motion profile $h(f-f_{lead})$ until a best fit is obtained (block 424 of FIG. 17). This is performed in one embodiment using a non-linear minimization algorithm. The sliding of the robot motion profile is achieved by varying a robot frame offset that shifts the frame number of the robot motion profile relative to that of the wafer image until an optimum fit is obtained. The shifted robot motion profile is then substituted for the wafer image Y-axis motion profile (block 432 of FIG. 17).

In an alternative robot motion-based method (branch 426 of block 422 of FIG. 17), the foregoing optimization is performed but a constraint is imposed that forces the distance (in frame numbers) along the Y-axis between the leading and trailing edges of the wafer to equal the known wafer diameter (e.g., 300 mm).

An advantage of substituting the shifted robot motion profile for the wafer image motion profile is that the robot motion profile is derived from a predetermined continuous (smooth) motion profile defined for the robot.

As one alternative (branch 434 of block 420 of FIG. 17), the wafer image motion profile is smoothed without substituting any robot motion profile, and instead conventional smoothing methods are employed using spline, averaging, interpolation and/or extrapolation techniques (block 436). The data may be smoothed beyond the edges of the wafer image (block 438) before outputting the smoothed wafer motion profile (block 432).

The apparatus of FIGS. 1-3 may serve a number of different applications. For example, the image capture apparatus 130 may obtain the image of the wafer prior to its introduction into a particular one of the processing chambers 104 in order to obtain measurements of previously deposited thin film features, and then obtain another image of the same wafer following deposition of another thin film feature to obtain a second set of measurements that may be compared to the first set of measurements. This comparison may yield information useful in adjusting the processing of subsequent wafers.

As another example, after measuring the non-concentricity amplitude C and phase a in the manner described above with reference to FIG. 12C, these parameters may be forwarded by the image control processor 123 to the robot controller 113 for use as error correction feedback to correct the action of a wafer placement apparatus of the robot (e.g., of the atmospheric robot 112 of FIG. 1), so that the initial placement of each wafer on a robot blade provides a better concentricity.

The light source has been described above as a light source array 134 overlying the wafer 122 and on the same side of the wafer 122 as the camera 132. However, for better contrast in the image of the edge of the wafer 122, another light source 134' may be placed underneath the wafer 122 so as to illuminate the wafer backside. In this way, the camera 132 would view a clear silhouette image of the wafer edge, with enhanced contrast at the edges of the wafer in the image.

The light source has been described above as an array 134 of light emitting diodes having the same monochromatic emission spectrum. With such a monochromatic source, the interference effects in the light reflected from the wafer 122 may be analyzed using conventional interferometric techniques in order to deduce the variation in thickness of a thin film deposited on the surface of the wafer 122. The thin film thickness may be computed from the observed interference effects using conventional techniques. Furthermore, the thin film thickness may be computed for each one of a succession of locations near the edge of the thin film, and the change in thin film thickness observed and stored to define thin film edge taper profile. This taper profile in film thickness may then be compared with a desired taper profile to evaluate the process. In similar fashion, the edge taper profile of the wafer 122 may be measured as well.

FIG. 3 depicts the LED array 134 as a single row of discrete light emitters 154 having a monochromatic emission spectrum. However, the light source or LED array 134 may have a spectrum consisting of two (or more) predetermined discrete wavelengths. In this case, the light emitters or light emitting diodes 154 of the light source array 134 may consist of two (or more) separate arrays arranged as parallel rows of light emitters or diodes, each array or row having a monochromatic emission spectrum different from the other array or row. Each array or row may emit a monochromatic spectrum at a different wavelength, and each of the two arrays may be activated depending on the wafer type or type of material in a layer of interest on the wafer surface, to ensure optimal contrast. Optimal contrast is wavelength dependent, as different types of layers or layers of different materials will reflect differently at different wavelengths. For example, one wavelength may be about 450 nm and the other wavelength may be about 600 nm. Alternatively the LED array 134 may have three rows of light emitters, each row emitting a different wavelength. The three wavelengths may correspond for example to red, blue and green, and each may be activated in synchronism with the camera, once every third frame, to provide a color RGB image of the wafer.

The measurements of film thickness may be compared with specified or desired film thickness values (or edge taper profile) and the comparison may be used to adjust one or more process parameters of one of the processing chambers 104 of FIG. 1 (e.g., deposition time, temperature, precursor gas composition, etc.).

While the foregoing is directed to embodiments of the present invention, other and further embodiments of the invention may be devised without departing from the basic scope thereof, and the scope thereof is determined by the claims that follow.

What is claimed is:

1. A method for obtaining an image of a workpiece in a processing system comprising at least one processing chamber and a robot for transporting a workpiece to said at least one processing chamber along a workpiece transit path, said method comprising:
    causing said robot to transport the workpiece along said workpiece transit path;
    capturing at a variable frame rate successive frames of an elongate stationary field of view transverse to a portion of said workpiece transit path lying within said field of view, said field of view having a length not less than a diameter of said workpiece and a width that is a fraction of said diameter, said successive frames corresponding to respective slices of a still image of said workpiece;
    illuminating at least a portion of said workpiece within said field of view;
    obtaining information defining movement of said robot, and, during said capturing, computing from said information a current velocity of said workpiece;
    adjusting said variable frame rate in accordance with a difference between said current velocity of said workpiece and a reference velocity or previous velocity; and
    providing a still image of said workpiece comprising said successive frames.

2. The method of claim 1 wherein said reference velocity comprises a velocity of said workpiece occurring during a previous one of said successive frames.

3. The method of claim 1 wherein said adjusting comprises maintaining an at least nearly constant ratio between said variable frame rate and the current velocity of said workpiece for each one of said successive frames.

4. The method of claim 1 wherein said successive frames comprise a leading frame coinciding with a leading edge of said workpiece, a trailing frame coinciding with a trailing edge of said workpiece and frames captured after said leading frame and before said trailing frame.

5. The method of claim 1 wherein said elongate stationary field of view has a width on the order of magnitude of one picture element of said image.

6. The method of claim 5 wherein said elongate field of view has a length on the order of magnitude of a thousand picture elements of said image.

7. The method of claim 1 further comprising obtaining said information from a robot controller memory that contains robot command data defining a predetermined robot velocity profile.

8. The method of claim 1 further comprising obtaining said information from an encoder that is responsive to movement of said robot.

9. The method of claim 1 wherein said capturing comprises capturing a signal from an elongate array of photosensitive elements, and wherein said illuminating comprises providing an array of light emitting elements in a pattern that illuminates individual ones of said photosensitive elements through a range of incident angles.

10. The method of claim 1 wherein said portion of said workpiece transit path corresponds to a Y-axis parallel to said portion of said workpiece transit path and an X-axis normal to said Y-axis, said method further comprising correcting X-axis coordinates in said image for distortion attributable to a misalignment angle between said field of view and said X-axis.

11. The method of claim 10 wherein said correcting X-axis coordinates comprises:
    determining said misalignment angle by matching a motion of a wafer center location in successive frames to a function of said misalignment angle; and
    correcting said X-axis coordinates by a correction factor comprising said function of said misalignment angle.

12. The method of claim 1 further comprising correcting said image for distortion from vibration of said workpiece in a plane of said workpiece.

13. The method of claim 12 wherein said correcting said image for distortion from vibration of said workpiece in a plane of said workpiece comprises:
    finding the motion of a center of the wafer in successive ones of said frames;
    defining an average motion of the center of the wafer through said successive frames;
    for each frame containing a difference between the wafer center and said average motion of the center of the wafer, shifting said image by said difference.

14. The method of claim 1 further comprising correcting said image for distortion from vibration of said workpiece in a direction transverse to the plane of said workpiece.

15. The method of claim 14 wherein said correcting said image for distortion from vibration of said workpiece in a direction transverse to the plane of said workpiece comprises:
    determining an apparent workpiece radius from said image and determining a radial correction factor as a ratio between said apparent workpiece radius and a known workpiece radius;
    scaling radial locations in said image by said radial correction factor.

16. The method of claim 1 further comprising:
    determining a center of said workpiece in each one of said frames;
    determining a motion of said center of said workpiece over said successive frames;
    matching said motion of said center of said workpiece to a sinusoidal function, and deducing a sinusoidal amplitude as an amplitude of non-concentricity of said workpiece and a sinusoidal phase angle as a direction of non-concentricity of said workpiece.

17. The method of claim 16 further comprising:
    providing said amplitude of non-concentricity and said direction of non-concentricity as corrective feedback to said robot.

18. The method of claim 1 wherein said illuminating comprises providing respective wavelengths of light from respective parallel rows of discrete light emitters, wherein each one of said rows emits a monochromatic spectrum corresponding to a respective one of said wavelengths.

19. The method of claim 18 comprising selecting a particular one of said parallel rows of light emitters for activation during capturing of said successive frames depending upon a type of material in a layer on said workpiece to be illuminated.

20. The method of claim 18 wherein said illuminating comprises illuminating said portion of said workpiece in said field of view with different wavelengths of light during capturing of successive ones of said frames whereby to produce a color image of said workpiece.

* * * * *